(12) United States Patent
Wehner et al.

(10) Patent No.: US 9,472,697 B2
(45) Date of Patent: Oct. 18, 2016

(54) PHOTODETECTOR WITH SURFACE PLASMON RESONANCE

(71) Applicant: RAYTHEON COMPANY, Waltham, MA (US)

(72) Inventors: Justin Gordon Adams Wehner, Goleta, CA (US); Edward Peter Gordon Smith, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/596,993

(22) Filed: Jan. 14, 2015

(65) Prior Publication Data

US 2016/0181448 A1    Jun. 23, 2016

Related U.S. Application Data

(62) Division of application No. 13/611,543, filed on Sep. 12, 2012, now Pat. No. 8,941,203.

(60) Provisional application No. 61/605,549, filed on Mar. 1, 2012.

(51) Int. Cl.

| | |
|---|---|
| *H01L 31/00* | (2006.01) |
| *H01L 31/101* | (2006.01) |
| *H01L 31/0232* | (2014.01) |
| *H01L 27/142* | (2014.01) |
| *H01L 31/04* | (2014.01) |
| *H01L 31/09* | (2006.01) |

(52) U.S. Cl.
CPC ......... *H01L 31/02327* (2013.01); *H01L 31/00* (2013.01); *H01L 31/1013* (2013.01); *H01L 27/142* (2013.01); *H01L 31/04* (2013.01); *H01L 31/09* (2013.01)

(58) Field of Classification Search
CPC ............. H01L 31/00; H01L 31/02024; H01L 31/119; H01L 31/042; H01L 31/04; H01L 31/09; H01L 31/1032; H01L 31/02327; H01L 31/1013; H01L 27/3269; H01L 2224/75753; H01L 25/167; H01L 27/142; H01L 27/14643; H01L 27/3227
See application file for complete search history.

(56) References Cited

U.S. PATENT DOCUMENTS

| | | | |
|---|---|---|---|
| 4,611,385 | A | 9/1986 | Forrest et al. |
| 5,457,331 | A | 10/1995 | Kosai et al. |
| 5,731,621 | A | 3/1998 | Kosai |

(Continued)

OTHER PUBLICATIONS

Myers et al. Performance of InAsSb-based Infrared Detectors with nBn Design. Proc. of SPIE vol. 7807, 2010, pp. 780805-1-780805-9.*

(Continued)

*Primary Examiner* — Galina Yushina
(74) *Attorney, Agent, or Firm* — Lando & Anastasi, LLP (57) ABSTRACT

Methods and structures for providing single-color or multi-color photo-detectors leveraging plasmon resonance for performance benefits. In one example, a radiation detector includes a semiconductor absorber layer having a first electrical conductivity type and an energy bandgap responsive to radiation in a first spectral region, a semiconductor collector layer coupled to the absorber layer and having a second electrical conductivity type, and a plasmonic resonator coupled to the collector layer and having a periodic structure including a plurality of features arranged in a regularly repeating pattern.

18 Claims, 11 Drawing Sheets

(56) References Cited

U.S. PATENT DOCUMENTS

| | | |
|---|---|---|
| 5,959,339 A | 9/1999 | Chapman et al. |
| 6,034,407 A | 3/2000 | Tennant et al. |
| 6,049,116 A | 4/2000 | Park et al. |
| 6,455,908 B1* | 9/2002 | Johnson ............... B82Y 20/00 257/184 |
| 7,671,341 B2 | 3/2010 | Jones et al. |
| 7,768,689 B2 | 8/2010 | Furuyama |
| 7,872,233 B2 | 1/2011 | Hu et al. |
| 7,923,689 B2 | 4/2011 | Kirby et al. |
| 8,143,687 B2 | 3/2012 | Wehner et al. |
| 8,513,586 B2 | 8/2013 | Yamamoto |
| 2004/0108564 A1* | 6/2004 | Mitra ............... H01L 27/14649 257/442 |
| 2007/0194357 A1* | 8/2007 | Oohashi ............... H01L 31/108 257/292 |
| 2008/0217542 A1 | 9/2008 | Verma et al. |
| 2009/0008735 A1 | 1/2009 | Ogino et al. |
| 2009/0146198 A1 | 6/2009 | Joe et al. |
| 2010/0327394 A1 | 12/2010 | Silver et al. |
| 2011/0031399 A1* | 2/2011 | So ............... H01L 27/288 250/330 |
| 2011/0037097 A1* | 2/2011 | Scott ............... B82Y 20/00 257/184 |
| 2011/0204214 A1* | 8/2011 | Bahir ............... H01L 31/0304 250/214.1 |

OTHER PUBLICATIONS

Rosenberg et al. A multispectral and polarization-selective surface-plasmon resonant midinfrared detector. Applied Physics Letters 95, 161101 (2009), pp. 161101-1 to 16119103.*

Saleh: Semiconductor Photon Detectors, Chapter 17, 1991, pp. 644, 657-658.

Le Perchec et al., "Plasmon Based Photosensors Comprising a Vary Thin Semiconducting Region", Applied Physics Letters, 1994, p. 181104.

* cited by examiner

PHOTODETECTOR WITH SURFACE PLASMON RESONANCE

CROSS-REFERENCE TO RELATED APPLICATIONS

This application is a division of and claims the benefit under 35 U.S.C. §120 and 121 of co-pending U.S. application Ser. No. 13/611,543 filed on Sep. 12, 2012 and titled "PHOTODETECTOR WITH SURFACE PLASMON RESONANCE," now U.S. Pat. No. 8,941,203, which claims priority under 35 U.S.C. §119(e) to U.S. Provisional Patent Application No. 61/605,549 titled "PHOTODETECTOR WITH SURFACE PLASMON RESONANCE" filed on Mar. 1, 2012, both of which are incorporated herein by reference in their entireties.

BACKGROUND

Infrared detectors are used in a wide variety of applications including, for example, remote sensing, infrared astronomy, and various military applications. Infrared detectors are generally sensitive to thermal noise, and are therefore often cooled to cryogenic operating temperatures, for example, approximately 77 Kelvin (K). Recently, there has been a significant interest in higher operating temperature (HOT) infrared detectors, particularly HOT infrared focal plane arrays (FPAs), to remove or reduce the need for expensive cooling systems. Current approaches to realizing HOT detectors have focused on either the material design to address fundamental mechanisms such as Auger recombination, or reducing the volume of the detector to reduce sensitivity to thermal noise. However, by focusing on only one aspect of the problem at a time (either recombination or volume reduction), current approaches limit their utility, and even when ideally implemented, these solutions do not necessarily achieve a high enough operating temperature to provide significant benefit.

SUMMARY OF INVENTION

Aspects and embodiments are directed to methods and apparatus for achieving a HOT detector that address both volume reduction and recombination mechanisms in one device, thereby providing a superior solution. As discussed in more detail below, certain embodiments are directed to a focal plane array or other infrared detector that includes a plasmonic resonator in combination with a reduction in thickness of the absorber layer of the device. These detectors may be single-color or dual-color.

According to one embodiment, a radiation detector comprises a semiconductor absorber layer having a first electrical conductivity type and an energy bandgap responsive to radiation in a first spectral region, a semiconductor collector layer coupled to the absorber layer and having a second electrical conductivity type, and a plasmonic resonator coupled to the collector layer and having a periodic structure including a plurality of features arranged in a regularly repeating pattern.

In one example, the periodic structure of the plasmonic resonator is a grating, and the plurality of features includes a plurality of ridges which may or may not be interconnected to each other. In one example, the absorber layer is an n-type semiconductor material, and the collector layer is a p-type semiconductor material. In another example, the absorber layer is a p-type semiconductor material, and the collector layer is an n-type semiconductor material. In another example, the first electrical conductivity type of the absorber layer is one of n-type and p-type, the second electrical conductivity type of the collector layer is the same as the first electrical conductivity type, and the absorber layer is separated from the collector layer by a barrier.

In one example, the first spectral region includes a plurality of wavelengths including at least one first wavelength and at least one second wavelength that is longer than the first wavelength, wherein the absorber layer includes a first region responsive to radiation having the at least one first wavelength and a second region responsive to radiation having the at least one second wavelength, and wherein the plasmonic resonator is configured to focus the radiation having the at least one first wavelength into the first region of the absorber layer. The first region of the absorber layer may have a thickness approximately equal to a depletion width of the radiation detector.

In another example the absorber layer is a first absorber layer and the collector layer is a first collector layer, and the radiation detector further comprises a second semiconductor absorber layer having the first electrical conductivity type and a second energy bandgap responsive to radiation in a second spectral region, and a second semiconductor collector layer coupled to the second absorber layer and positioned between the second absorber layer and the first absorber layer. The first electrical conductivity type may be n-type, and the second electrical conductivity type may be p-type, for example. The first spectral region may include a first plurality of wavelengths, and the second spectral region may include a second plurality of wavelengths that are shorter than the first plurality of wavelengths. In one example the second spectral region includes at least a portion of one of the NIR, SWIR, MWIR and LWIR spectral regions. In another example the first absorber layer has a thickness approximately equal to a depletion width of the radiation detector. In another example the radiation detector further comprises a substrate, the absorber layer being formed on the substrate and positioned between the substrate and the collector layer.

According to another embodiment a dual-band radiation detector comprises a first collector layer having a first electrical conductivity type, a first absorber layer having a second electrical conductivity type and a first energy bandgap responsive to radiation in a first spectral region including a first plurality of wavelengths, a second absorber layer having the second electrical conductivity type and a second energy bandgap responsive to radiation in a second spectral region including a second plurality of wavelengths longer than the first plurality of wavelengths, the first collector layer being positioned between the first and second absorber layers, a third layer coupled to the second absorber layer, the second absorber layer being positioned between the third layer and the first collector layer, and a plasmonic resonator coupled to third layer and having a grating structure including a plurality of ridges arranged in a regularly repeating pattern, the plasmonic resonator being configured to focus the radiation in the second spectral region to the second absorber layer In one example the first collector layer comprises a p-type material, the first and second absorber layers each comprises an n-type material, and the third layer comprises an n+-type material. In another example the first and second spectral regions are infrared spectral regions.

According to another embodiment, a dual-band radiation detector comprises a first absorber layer having a first electrical conductivity type and a first energy bandgap responsive to radiation in a first spectral region including a first plurality of wavelengths, a second absorber layer having the first electrical conductivity type and a second energy bandgap responsive to radiation in a second spectral region including a second plurality of wavelengths longer than the first plurality of wavelengths, a barrier layer disposed between the first absorber layer and the second absorber layer, and a plasmonic resonator coupled to second absorber layer and having a grating structure including a plurality of ridges arranged in a regularly repeating pattern, the plasmonic resonator being configured to focus the radiation in the second spectral region to the second absorber layer.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Higher operating temp (HOT) focal plane arrays, or other infrared detectors, may be achieved through various mechanisms, some of which include reducing the volume of the detector. As discussed above, infrared detectors are sensitive to thermal noise, which is why these detectors are typically cooled to cryogenic operating temperatures. Noise mitigation may be achieved by volume reduction of the noisier bandgap regions within the infrared detector. However, reducing the detector volume may result in lost performance. Accordingly, aspects and embodiments are directed to a mechanism for compensating for this lost performance. In particular, aspects and embodiments provide an approach for realizing a HOT detector that addresses both the relationship between detector volume and quantum efficiency and the fundamental recombination mechanisms that limit performance at high temperatures. According to one embodiment, a HOT detector leverages surface Plasmon resonance for performance improvement. As discussed in more detail below, this technique may provide a powerful resonant structure to allow two-fold improvement as the longer wavelength absorber may be both very small and in some instances fully depleted.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
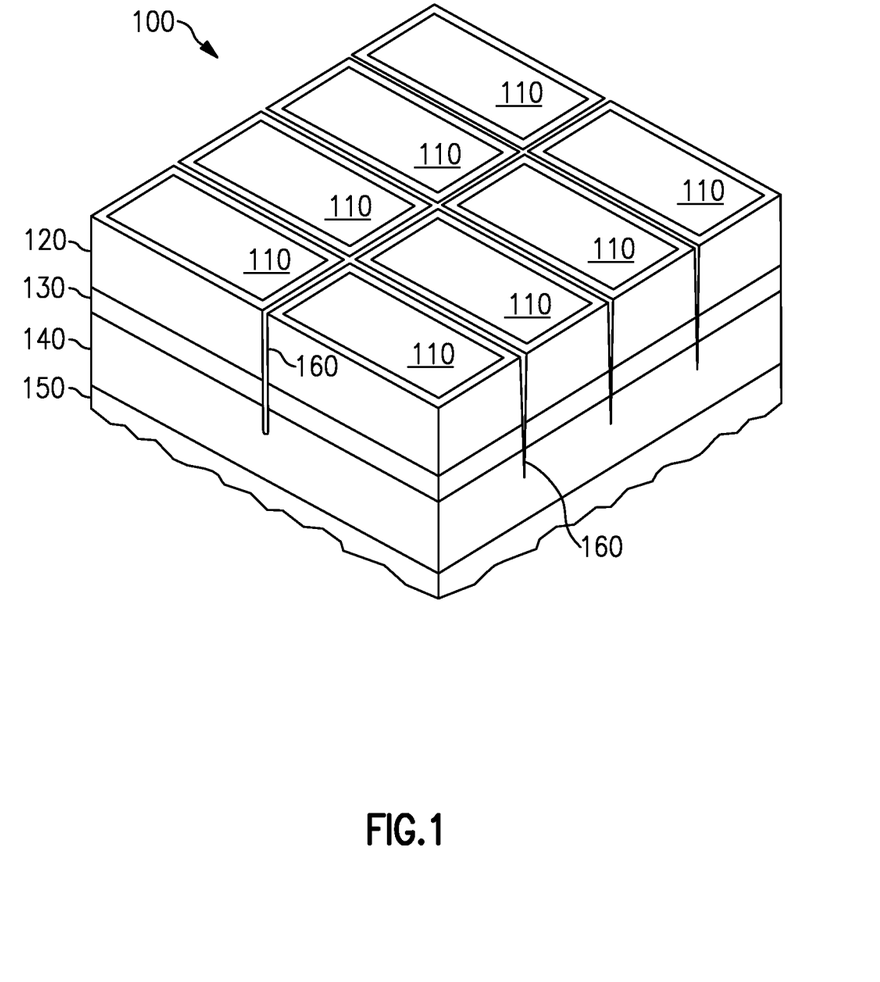
FIG. 1 is a perspective view of one example of a portion of focal plane array of an infrared detector according to aspects of the invention.

Referring to FIG. 1, there is illustrated an example of a focal plane array (FPA) 100 of infrared detectors 110. In the illustrated example, the FPA 100 includes a two-dimensional array of eight detectors 110; however those skilled in the art will appreciate, given the benefit of this disclosure, that the FPA may include any number of detectors arranged in one, two or three dimensions. Additionally, each infrared detector 110 may have any shape and dimension suitable for radiation detection. In this example, each infrared detector 110 includes multiple semiconductor layers 120, 130 and 140; however, as discussed further below, in other embodiments, the detectors may include more or fewer semiconductor layers. One or more substrates 150 may provide a base upon which the semiconductor layer(s) 120, 130 and/or 140 may be formed. The infrared detectors 110 may be at least partially separated from one another by gaps 160 in which little or no absorption occurs. Each detector 110 may correspond to a pixel of the FPA 100.

The substrate 150 may be a wafer comprised of silicon (Si), germanium (Ge), cadmium telluride (CdTe), cadmium zinc telluride (CdZnTe), gallium arsenside (GaAs), and/or any other suitable substrate material or combination of substrate materials upon which the semiconductor layers 120, 130, and/or 140 may be formed. The semiconductor layer(s) 120, 130 and/or 140 may be formed using any suitable semiconductor process, including epitaxy, for example, such as molecular beam epitaxy, metalorganic vapor phase epitaxy or liquid phase epitaxy. At least one of the semiconductor layers 120, 130 and/or 140 may include a material having energy bandgaps responsive to radiation in a spectral region (or waveband) of interest (referred to as an absorber layer). Some examples of materials include, but are not limited to, Silicon, GaAs, InGaAs, HgCdTe, Lead chalcogenides, and super lattices.

Figure 2:
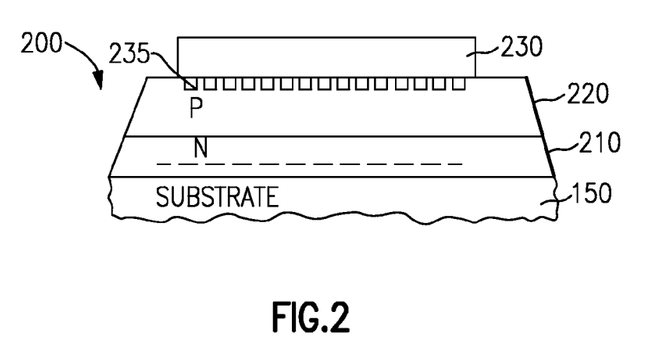
FIG. 2 is a cross-sectional view of one example of an infrared detector according to aspects of the invention.

According to one embodiment, one or more of the detectors 110 are configured to leverage surface Plasmon resonance to thin at least one of the semiconductor layers acting as the absorber for at least one waveband of the detector. Referring to FIG. 2, there is illustrated an example of a single-waveband (also referred to as single-color) photodetector 200, according to one embodiment. The photodetector 200 includes a semiconductor absorber layer 210, which may be formed on a substrate 150 using any suitable semiconductor manufacturing process, as discussed above, and has an energy bandgap responsive to radiation in a spectral region of interest. A semiconductor collector layer 220 is coupled to the absorber layer 210 and provides an electrical connection for the photodetector 200. In the illustrated example, the absorber layer 210 is an n-type layer and the collector layer 220 is a p-type layer, thereby creating a p-n junction. However, it is to be appreciated that the electrical conductivity type of the layers 210, 220 may be reversed in other examples. In addition, as discussed further below, the device may be formed with an NBN-type configuration, rather than a p-n (or n-p) junction. An NBN configuration is a barrier type device where n is the doping type. The device may alternatively be formed with a PBP configuration, namely, a barrier type device where p is the doping type. A plasmonic resonator 230 is fabricated on the detector 200 and provides an electrical contact structure for the detector. The plasmon resonator 230 is a metal layer.

The plasmonic resonator 230 operates by resonating incident flux, causing a field to be built up in the absorptive region (absorber layer 210) of the detector 200. Generated carriers are separated and collected in the absorptive region in accord with normal operation of a photovoltaic device. In the illustrated example, the plasmonic resonator 230 is formed with a grating structure that includes protrusions or ridges 235 that are periodically spaced. The dimensions of the ridges 235 and period of the grating may be tailored to focus plasma waves into the absorber layer 210, and to achieve a desired wavelength selectivity or polarization selectivity, as discussed further below. In addition, the design of the plasmonic resonator may be varied on a per pixel basis, to provide individualized spectral and/or polarization responses for the pixels of a detector array. Responsive to incident radiation in the z-direction (generally normal to the surface of the detector 200), the plasmonic resonator 230 causes a resonance in the x-y plane, thereby allowing a very thin absorber layer 210 to collect substantially all photons and maintain a high quantum efficiency. As a result, volume reduction (thinning) of the absorber layer 210 may not hinder optical performance of the detector 200, thereby improving signal to noise.

In one embodiment, the resonance of the plasmonic resonator 230 allows the absorber layer 210 to be sufficiently thinned such that it may be fully depleted or close or fully depleted at standard operating voltages. Depletion of the absorber layer 210 means that limiting mechanisms at high temperatures, such as Auger recombination, are suppressed. Furthermore, as discussed above, volume reduction also reduces the sensitivity of the device to thermal noise, and reduces "dark current." Dark current is the constant response exhibited by a receptor of radiation during periods when it is not actively being exposed to light. In particular, in the context of a photodetector or photovoltaic device, dark current refers to the relatively small electric current that flows through the photosensitive device when no photons are entering the device.

Figure 3A:
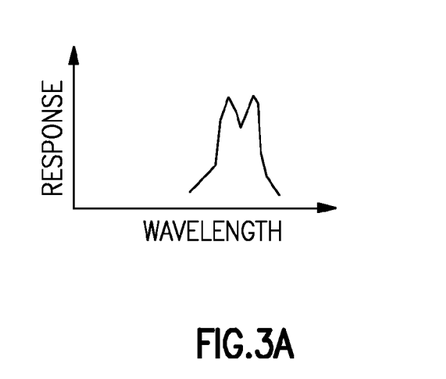
FIG. 3A is a graph illustrating a spectral profile for the example infrared detector of FIG. 2.

As discussed above, the detector 200 illustrated in FIG. 2 is a single-color (or single-waveband) device. There are several single-color implementations that may leverage surface Plasmon resonance for various different sensing applications. For example, the detector 200 of FIG. 2 may provide a narrow-band sensor that may be used for resonant detection. FIG. 3A illustrates an example spectral profile of the detector 200 of FIG. 2 configured as an infrared detector (i.e., the absorber layer 210 is selected to include one or more materials responsive to infrared radiation). FIG. 3A represents a generic spectral response. The specific spectral response of an exemplary device may be dependent on the combination of the absorber material cut-off wavelength and optical properties, absorber thickness (which may be much thinner than a conventional absorbing layer, as discussed above), and dimensions of the resonator. The dimensions of the resonator are typically determined by the operating wavelength, material properties, and desired response/sensitivity. For example, a device having a spectral response of the form illustrated in FIG. 3A may include an MWIR absorber, a cut-off wavelength of approximately 5 µm, an absorber thickness of approximately 500 nm, and a resonator period of approximately 0.5-2 µm.

Figure 3B:
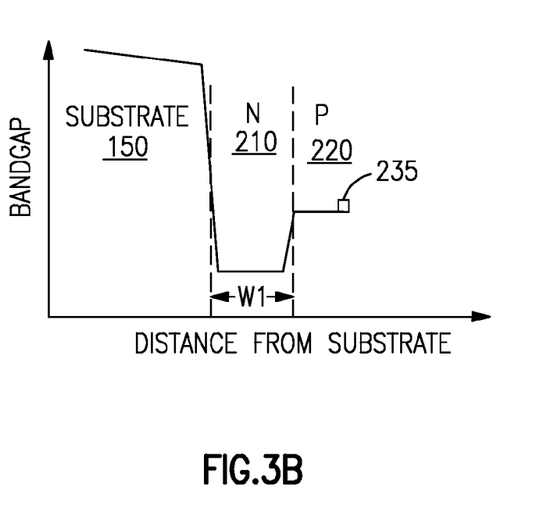
FIG. 3B is a diagram illustrating energy levels in the layers of the infrared detector of FIG. 2.

FIG. 3B illustrates a corresponding diagram showing energy levels across an example of the detector 200 of FIG. 2. As discussed above, the width W1 of the absorber layer 210 may be made very narrow, in one example, approximately the same as the depletion width of the detector, such that the device may be operated fully depleted. Such a sensor may realize a HOT detector with good performance through the reduction of thermal noise, dark current, and other limiting factors, as discussed above.

According to another embodiment, a single-color photodetector may be implemented for broad-band sensing. For example, a broad-band detector may be implemented, leveraging the reduced dark current of the device, by confining the shortest wavelengths to a very narrow, optionally fully depleted absorber, while allowing other wavelengths to be absorbed through more standard absorbers. An example of such a detector is illustrated in FIG. 4.

Figure 4:
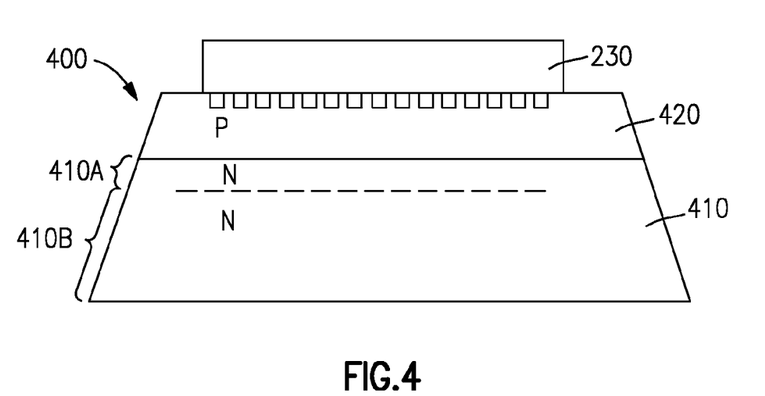
FIG. 4 is a cross-sectional view of another example of an infrared detector according to aspects of the invention.
Figure 5A:
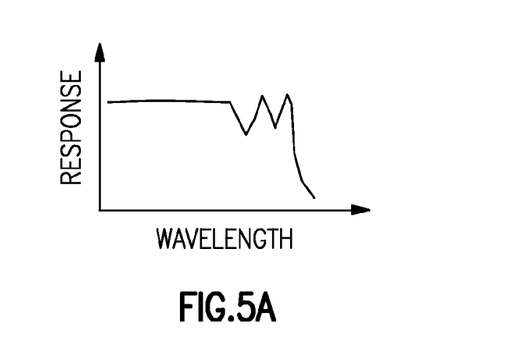
FIG. 5A is a graph illustrating a spectral profile for the example infrared detector of FIG. 4.
Figure 5B:
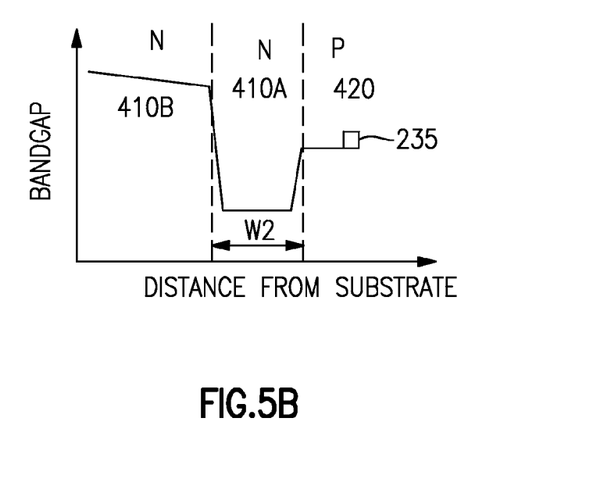
FIG. 5B is a diagram illustrating energy levels in the layers of the infrared detector of FIG. 4.

Referring to FIG. 4, in one example, a single-color broad-band photodetector 400 includes an absorber layer 410 that is divided into two regions, namely, region 410a and region 410b, as shown by the dotted line in FIG. 4. Absorber region 410a may be responsive to a certain group of wavelengths, for example, the shorter wavelengths of a waveband of interest, and the absorber region 410b may be sensitive to other wavelengths in the waveband of interest. The plasmonic resonator 230 may be configured to focus radiation with selected wavelengths into absorber region 410a. Accordingly, absorber region 410a may be made very thin, for example (referring to FIG. 5B), the width W2 of absorber region 410a may be approximately the same as the depletion width. Thus, in one example, the detector 400 may be operated with absorber region 410a fully depleted and leveraging the Plasmon resonance to achieve high quantum efficiency.

In one example, absorber region 410a resembles the detector 200 of FIG. 2 in operation, and may be a very narrow-band detector. Absorber region 410b may have a wider spectral range (or bandwidth). For example absorber region 410a may have a peak response at 4.5 µm with an FWHM response of 0.5-1 µm, while absorber 410b has a broad-band response over the region 1-4.25 µm region. Thus, the combination of the two color absorbers may cover the entire useful MWIR region, while having the dark current performance of only the shorter wavelength material 410b, which dominates dark current in the longer wavelength absorber 410a. Absorber region 410b may not receive resonant energy from the plasmonic resonator 230, and may absorb photons according to conventional photovoltaic processes. Thus, the surface plasmonic resonator 230 may be used to manage where absorption of photons with selected wavelengths occurs within a detector device to improve performance of the device. Accordingly, a broad-band device may be achieved by using the thin, narrow-band absorber region 410a for some wavelengths, and the thicker, broader-band absorber region 410b to capture the other wavelengths. In one example, the thickness of absorber region 410a may be approximately 300 nanometers (nm) and the thickness of absorber region 410b may be approximately 5 micrometers (µm).

Similar to FIG. 3A discussed above, FIG. 5A illustrates an example generic spectral profile for an infrared embodiment of detector 400. In one example, the detector 400 is configured for the infrared spectral region extending from approximately 3 µm to 5 µm. In another example, the detector 400 is configured for the infrared spectral region extending from approximately 8 µm to 12 µm. As discussed above, absorber region 410a is configured to detect a first subset of the spectral region, similar to the detector of FIG. 2, and absorber region 410b is configured to detect the remainder of the spectral region;

thereby achieving a broad-band, single-color device. As discussed above, FIG. 5B illustrates the corresponding energy level diagram for the example detector of FIG. 4.

As discussed above, other embodiments of detectors may include NBN detectors that instead of a p-n junction include a barrier layer between the absorber and the collector. The plasmonic resonator may be formed on the collector and the absorber may be thinned, as discussed above.

Figure 6:
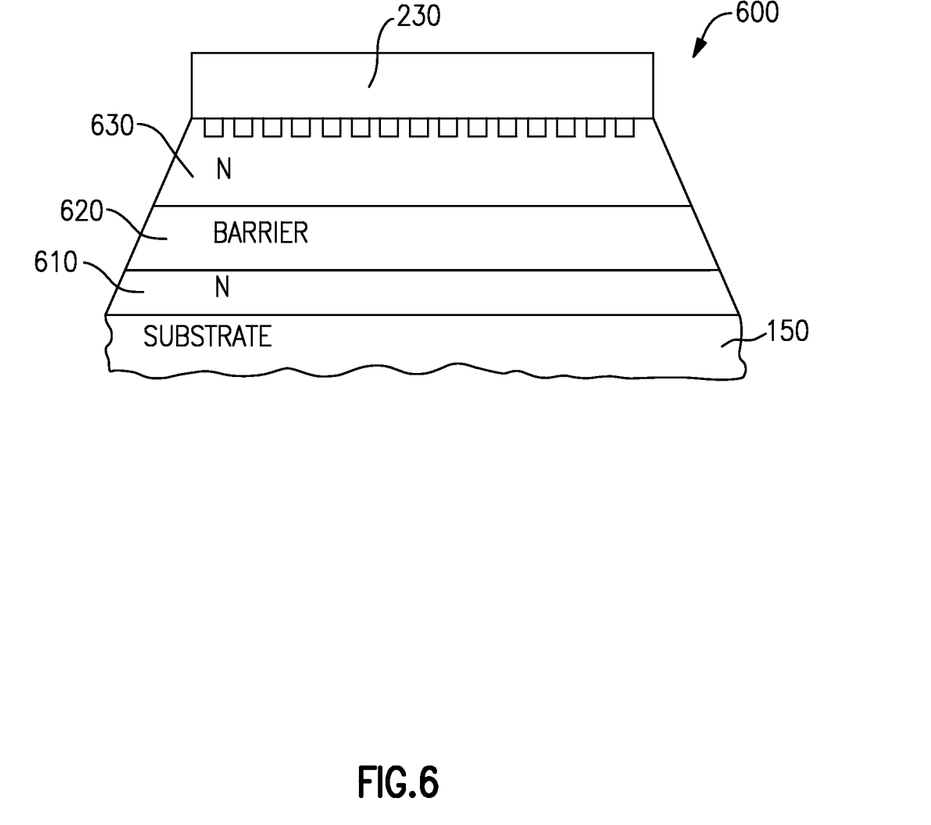
FIG. 6 is a cross-sectional view of another example of an infrared detector according to aspects of the invention.

One example of an NBN single-color detector is illustrated in FIG. 6. In this example, the detector 600 includes an absorber layer 610, a barrier layer 620 and a collector layer 630. The absorber layer 610 and the collector layer 630 may have the same electrical conductivity type, for example, n-type, and are separated from one another by the barrier layer 620. As discussed above, by using the plasmonic resonator 230 to focus plasma waves into the absorber layer 610, the absorber layer may be made very thin. In this context, "very thin" may be defined by optical absorption depth, rather than a physical property of the absorber layer. For example, a typical MWIR absorption depth is approximately 1-3 µm (and is wavelength dependent); therefore, a conventional absorber layer may typically be 5-10 µm thick. In contrast, according to certain aspects of the invention, the absorber layer 610 may be "very thin" in that the absorber thickness may be much less than the absorption depth. For example, an absorber layer of 300 nm thickness is approximately 5-10 times thinner than the typical MWIR absorption depth, and therefore may be considered very thin. The absorption depth is dependent on the material properties, and therefore the physical thickness of a "very thin" layer may be material dependent also.

Figure 7A:
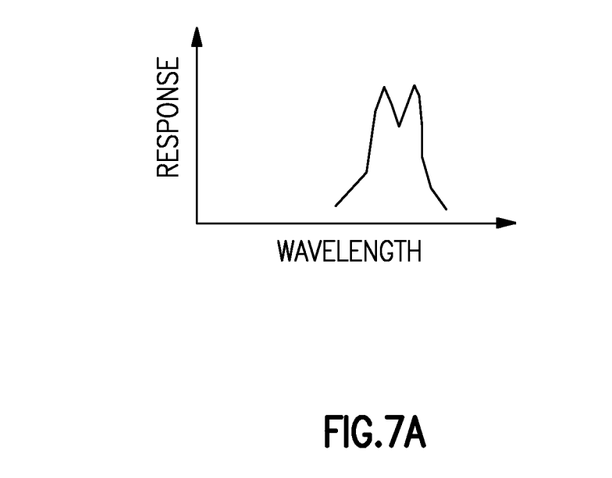
FIG. 7A is a graph illustrating a spectral profile for the example infrared detector of FIG. 6.
Figure 7B:
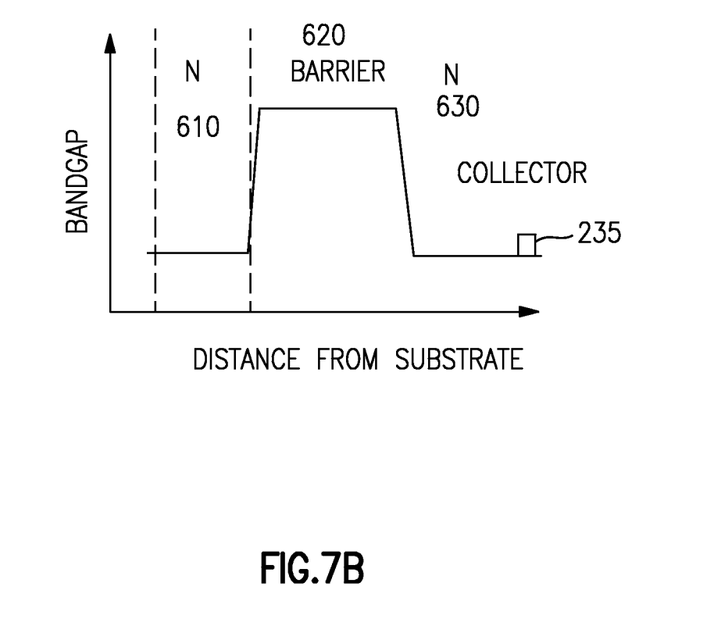
FIG. 7B is a diagram illustrating energy levels in some the layers of the infrared detector of FIG. 6.

This example detector 600 may be a narrow-band device, and may have a generic spectral response (an example of which is illustrated in FIG. 7A) similar to that of the detector 200 of FIG. 2. FIG. 7B illustrates an exemplary corresponding energy level diagram for the example detector 600 of FIG. 6.

Figure 8:
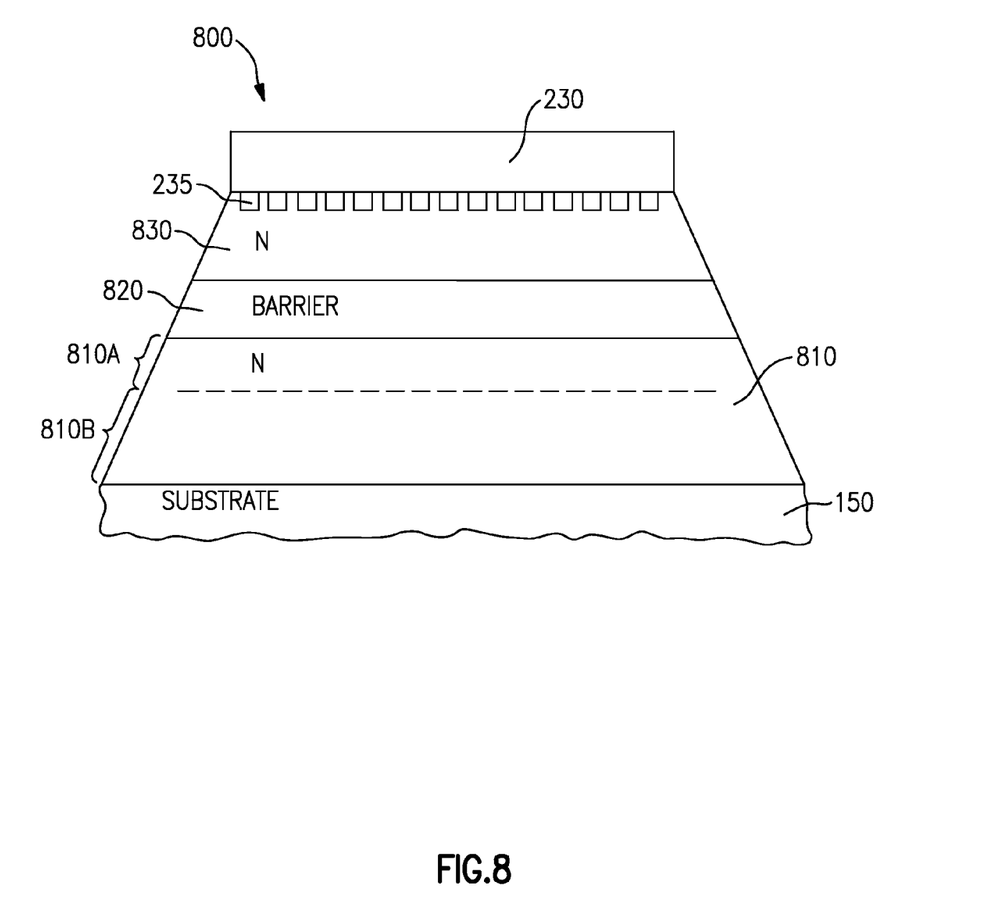
FIG. 8 is a cross-sectional view of another example of an infrared detector according to aspects of the invention.
Figure 9A:
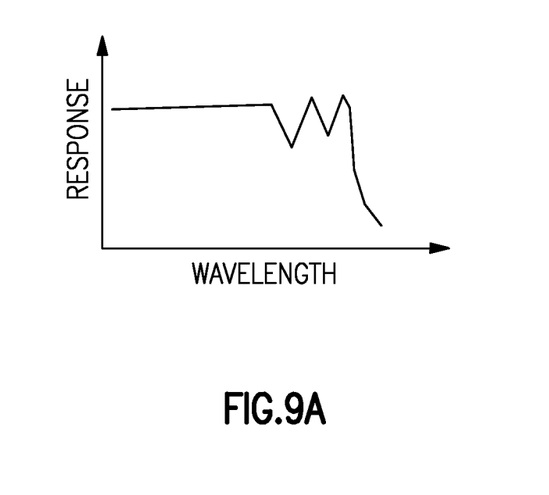
FIG. 9A is a graph illustrating a spectral profile for the example infrared detector of FIG. 8.

A broad-band single color detector, such as that discussed above with reference to FIG. 4, may also be implemented using an NBN configuration. An example of single-color, dual-absorber detector 800 is illustrated in FIG. 8. In this example, the detector 800 includes an absorber layer 810, which as discussed above, may be divided into two absorber regions 810a and 810b, one of which (810b) may be thinned due to the benefits provided by the plasmonic resonator 230. The dual-region absorber layer 810 may provide a broad-band single color spectral response (an example of which is illustrated in FIG. 9A). In one example, the detector 800 may be constructed such that the spectral response is similar to that of detector 400. The absorber layer 810 is separated from a collector layer 830 by a barrier layer 820. As discussed above with respect to FIG. 6, in this configuration, the absorber layer 810 and collector layer 830 may have the same electrical conductivity type. The plasmonic resonator 230 is formed on the collector layer 830.

Figure 9B:
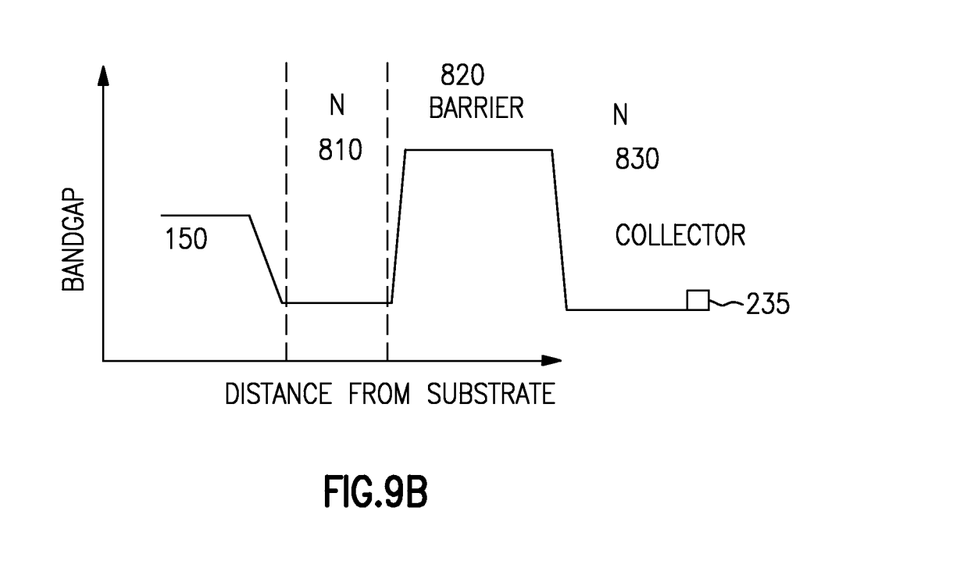
FIG. 9B is a diagram illustrating energy levels in some the layers of the infrared detector of FIG. 8.

FIG. 9A illustrates an example of the generic spectral response of detector 800, and FIG. 9B illustrates a corresponding exemplary energy level diagram. In one example, the detector 800 is configured to cover wavelength ranges from approximately 4.25-5 µm and less than 4.25 µm. In another example, in which InAlSb and InAsSb materials are used, the detector 800 may be configured to cover wavelength ranges from approximately 3.25-4 µm and less than 4 µm. As discussed above, super lattices may also be used for the detector materials.

According to another embodiment, a two-color (or dual-band) device may also be implemented using a surface plasmonic resonator, as discussed above. In one example, a dual-band detector leverages surface Plasmon resonance to thin one band of the detector, particularly the band most sensitive to dark current and limiting higher temperature operation. As a result, a HOT two-color or dual-band detector may be realized. In one example, for an infrared two-color detector, the detector may include two absorbing regions of different cut-off. The longer-wavelength absorbing region may be coupled to a plasmonic resonator, as discussed further below, and may be made very thin, in one example, on the order of the depletion width of the detector. This reduces the volume of the device and the dark current generating sources, while maintaining high quantum efficiency, as discussed above. The shorter-wavelength absorbing region may be a standard thickness absorber, and may not receive resonant energy from the plasmonic resonator.

Figure 10:
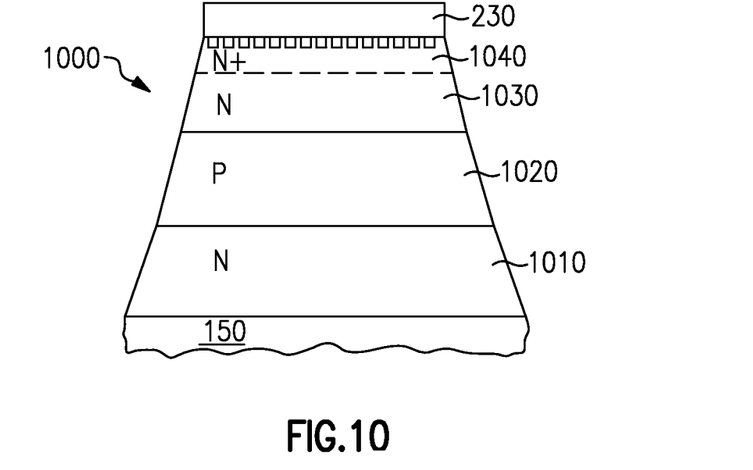
FIG. 10 is a cross-sectional view of another example of an infrared detector according to aspects of the invention.

Referring to FIG. 10, there is illustrated one example of a two-color detector 1000 including a plasmonic resonator 230. The detector 1000 includes a first absorber layer 1010 comprising a material having an energy bandgap responsive to radiation in a first spectral region, and a first collector layer 1020, which together provide detection for the first spectral region (referred to as the first color detector). The detector 1000 further includes a second absorber layer 1030 comprising a material having an energy bandgap responsive to radiation in a second spectral region. In the illustrated example, the collector layer for the second absorber 1030 is provided by a highly doped N+ layer 1040; however, in other examples, layer 1040 may be a p-type layer. Layers 1020, 1030 and 1040 together provide the second color detector. A variety of other suitable electrical conductivity variations may be used for the semiconductor layers 1010, 1020, 1030 and 1040. For example, as discussed further below, a dual-band detector may be implemented using an NBN configuration, as illustrated for example in FIG. 12. The contact structure of the second color detector is patterned to provide the surface plasmonic resonator 230, as discussed above.

In one example, the detector 1000 is an infrared detector, and the first color detector is the shorter wavelength detector and the second color detector is the longer wavelength detector. In a particular embodiment, absorber layer 1010 may have an energy bandgap responsive to a spectral range of approximately 0.5 μm to 5 μm, and semiconductor layer 1030 may have an energy bandgap responsive to a different spectral region, such as, for example, long-wavelength infrared (LWIR). In another example, the dual-band detector 1000 may include one band covering the infrared spectral region from approximately 3 μm to 5 μm, and another band covering the infrared spectral region from approximately 8 μm to 12 μm. In other embodiments, semiconductor layers 1010 and 1030 may be responsive to respective ones or more of near-infrared (NIR), short-wavelength infrared (SWIR), mid-wavelength infrared, LWIR, very-long wave infrared (VLWIR), and/or one or more other spectral regions that may or may not be within the infrared spectrum. As used herein, NIR radiation includes a spectral region extending from approximately 0.5 to 1 μm, SWIR radiation includes a spectral region extending from approximately 1 to 3 μm, MWIR radiation includes a spectral region extending from approximately 3 to 8 μm, LWIR radiation includes a spectral region extending from approximately 8 to 12 μm, and VLWIR radiation includes a spectral region extending from approximately 12 to 30 μm. Longer wavelength infrared radiation is generally more sensitive to thermal noise than is shorter wavelength infrared radiation. Accordingly, it may be advantageous to apply the benefits of the plasmonic resonator to the longer wavelength (second color) absorber layer 1030. However, in other examples, particularly if the detector 1000 is configured for a spectral region other than the infrared region, the second color detector may be the shorter wavelength detector.

In one embodiment, the second absorber layer 1030 is thinned, for example, until it is approximately a depletion region thickness. As illustrated in FIG. 10, the second absorber layer 1030 is sandwiched between two regions of higher band gap (and also higher doping density), namely the collector layers 1020 and 1040. In one example, the second color detector is operated fully depleted. This reduces Auger recombination, in some instances leaving only G-R recombination, which may be controlled through careful selection of the material quality (for the material of absorber layer 1030) and is not a fundamental material limit for higher temperature operation. In one example, the second color detector using the plasmonic resonator 230 is narrow-band, and may be configured for the wavelengths most sensitive to thermal noise, dark current or other limiting effects. The shorter wavelength absorber layer 1010 may be broad-band (as discussed above, this absorber may not be affected by the plasmonic resonator 230) and may be used to cover the wavelengths of the absorption spectrum of interest that are not detected by the narrow-band absorber 1030.

Another example of a dual-band radiation detector that may be modified to include a plasmonic resonator 230 coupled to the absorber layer associated with one spectral band of the detector is described in U.S. Patent Publication No. 2011/0147877 titled "MULTI-BAND, REDUCED-VOLUME RADIATION DETECTORS AND METHODS OF FORMATION," published on Jun. 23, 2011 and incorporated herein by reference in its entirety.

Figure 11A:
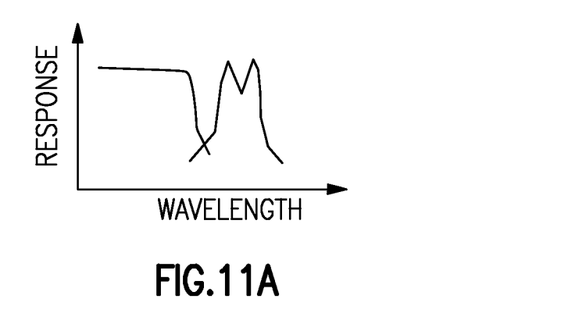
FIG. 11A is a graph illustrating a spectral profile for the example infrared detector of FIG. 10.
Figure 11B:
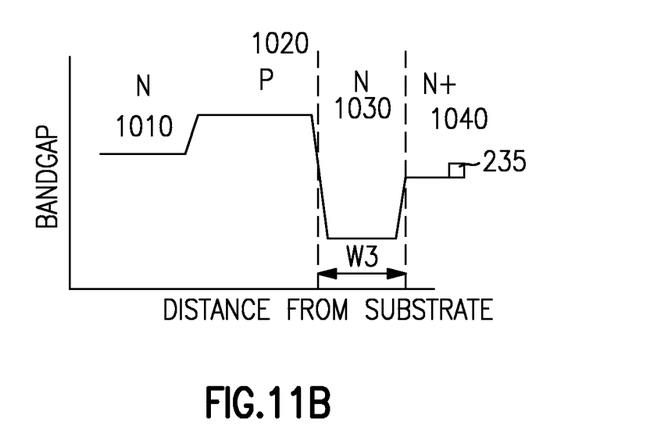
FIG. 11B is a diagram illustrating energy levels in some the layers of the infrared detector of FIG. 10.

FIG. 11A illustrates one example of a spectral profile corresponding to an infrared example of the detector 1000 of FIG. 10. In this example, the first color detector (using absorber layer 610) detects the first (shorter wavelength and broader band, for example the 3-5 μm MWIR window) spectral region 1110, and the second color detector (using the plasmonic resonator and absorber layer 1030) covers the second (narrow-band, longer wavelength, for example sections of the LWIR 8-12 um window, with the spectral content defined by the geometry of the resonator) spectral region 1120. FIG. 11B illustrates a corresponding portion of an energy level diagram including semiconductor layers 1020, 1030 and 1040, and the plasmonic resonator contact 235. As discussed above, in one example, the width W3 of the second absorber layer 1030 may be approximately the depletion thickness of the detector 1000. Examples of thickness include approximately 5-10 μm for Band 1 (the standard absorber thickness) and 300 nm for Band 2 (with plasmonic enhancement).

Figure 12:
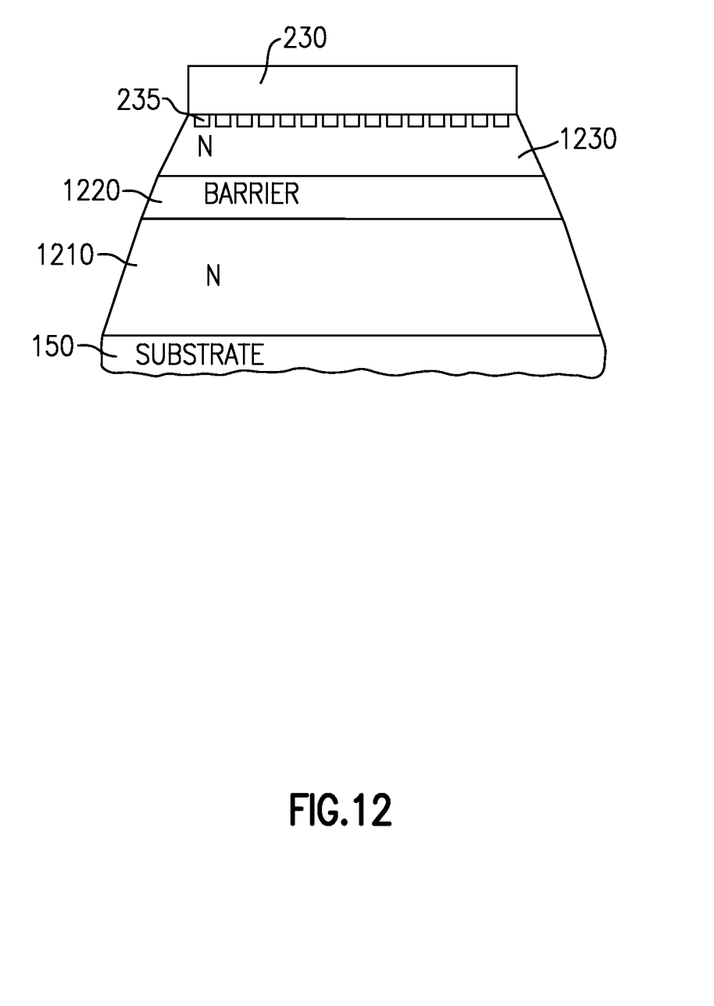
FIG. 12 is a cross-sectional view of another example of an infrared detector according to aspects of the invention.
Figure 13A:
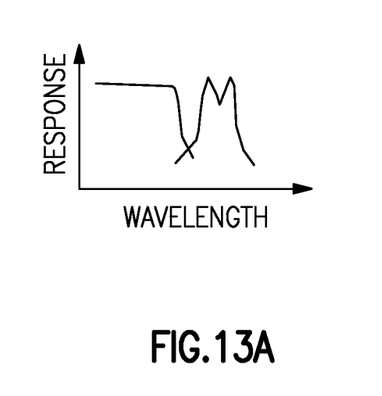
FIG. 13A is a graph illustrating a spectral profile for the example infrared detector of FIG. 12.
Figure 13B:
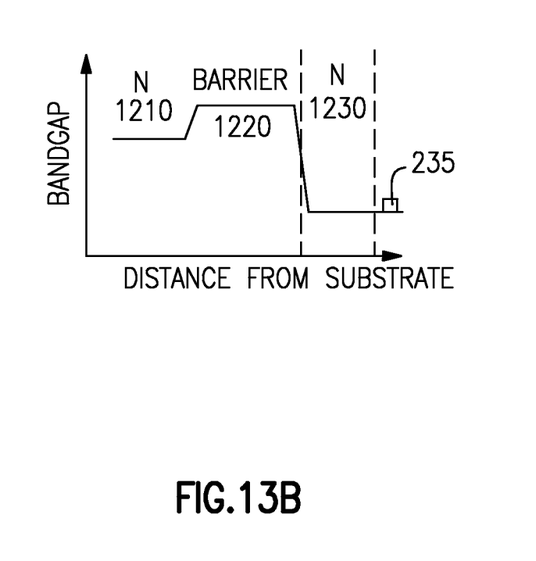
FIG. 13B is a diagram illustrating energy levels in some the layers of the infrared detector of FIG. 12.

As discussed above, a two-color detector may be implemented using an NBN configuration, as illustrated for example in FIG. 12. In this example, the detector 1200 includes a first absorber layer 1210 comprising a material having an energy bandgap responsive to radiation in a first spectral region, and a second absorber layer 1230 comprising a material having an energy bandgap responsive to radiation in a second spectral region. The two absorber layers are separated from one another by a barrier layer 1220. The plasmonic resonator 230 is coupled to the second absorber layer 1230 induces a resonance therein, as discussed above, to allow this layer to be thinned while maintaining high quantum efficiency. FIG. 13A illustrates an example of the spectral response of detector 1200, which may be similar to that of detector 1000. FIG. 13B illustrates a corresponding energy level diagram for an example of the detector 1200.

Figure 14:
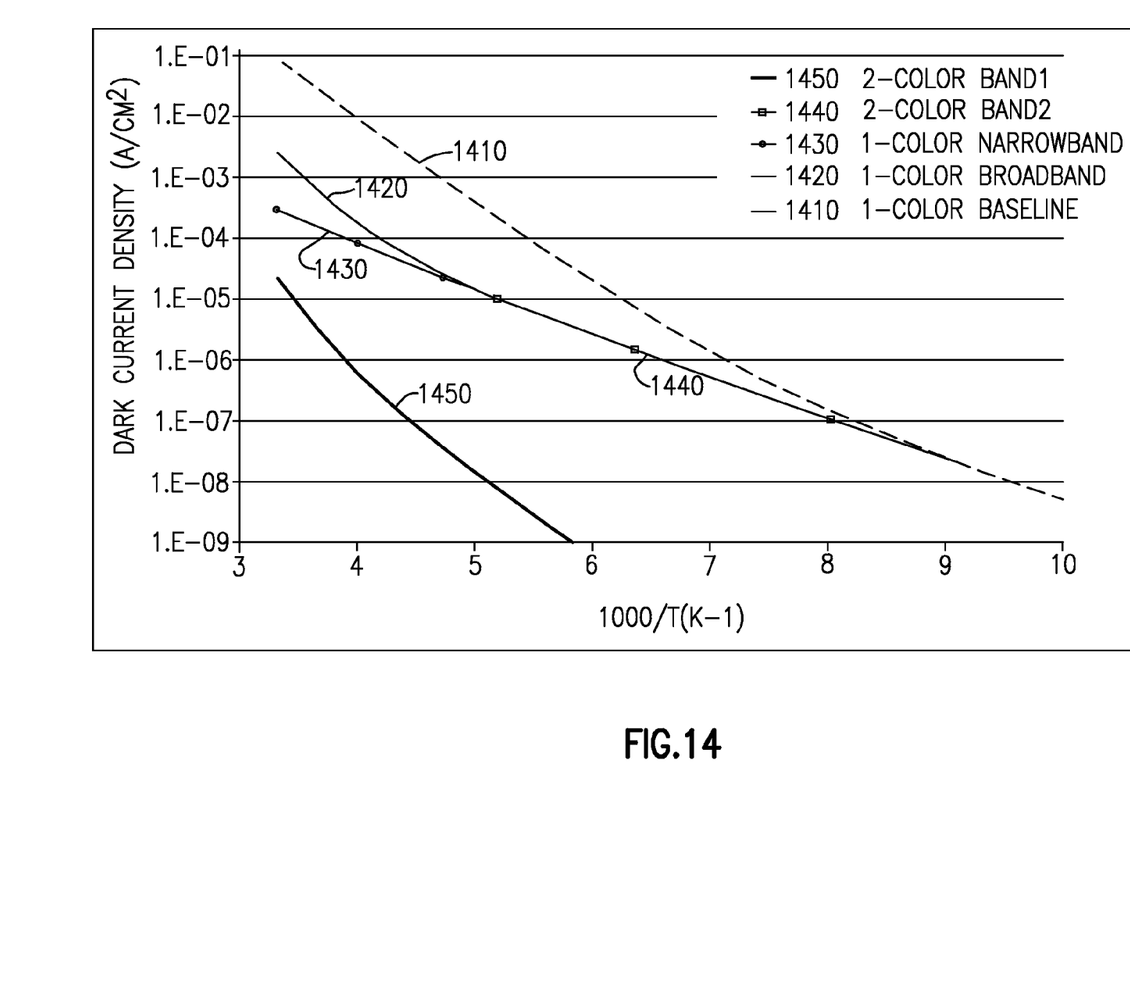
FIG. 14 is a graph illustrating simulated dark currents for the example infrared detectors of FIGS. 2, 4 and 10.

FIG. 14 is a graph showing simulated dark currents for various examples of detectors using plasmonic resonators in accord with certain embodiments. Dark current in amperes per square centimeter (y-axis) are plotted as a function of the normalized inverse operating temperature of the detector (x-axis; operating temperature decreasing to the right). Trace 1410 represents the dark current for a baseline single color detector without a plasmonic resonator (standard thickness absorber). Trace 1420 illustrates the dark current for an example of a single color broad-band detector, such as that illustrated in FIG. 4. Trace 1430 illustrates the dark current for an example of a single color narrow-band detector, such as that illustrated in FIG. 2. As can be seen with reference to FIG. 14, the dark current is substantially reduced for these example detectors utilizing the Plasmon resonance. Traces 1440 and 1450 corresponding to an example two-color detector, such as that shown in FIG. 10. Trace 1440 illustrates the dark current for the first spectral region or waveband of the detector (corresponding to absorber layer 1010), and trace 1450 illustrates the dark current for the second spectral region or waveband, corresponding to absorber layer 1030. In one example, by leveraging Plasmon resonance and operating the detectors fully depleted, an infrared detector may be made to perform with approximately 50 times less dark current at an operating temperature of 200 K than a conventional (e.g., the baseline; trace 1410) infrared detector.

Thus, aspects and embodiments provide a single- or dual-band radiation detector, for example, an infrared detector, in combination with a plasmonic resonator. As discussed above, the plasmonic resonator allows volume reduction of the absorber layer of one band (or selection of wavelengths) of the detector, for example, the narrowest bandgap material, while another absorber associated with the other band/color may allow broad-band detection at wavelengths not within the narrow-band spectral region influenced by the plasmonic resonator. Thus, a HOT detector may be realized by employing the plasmonic resonator to achieve a thin, optionally fully depleted, absorber for one spectral region or one or more wavelengths (e.g., the spectral region most sensitive to thermal noise or where highest resolution/performance is desired), and using a second absorber material for broader detector response (e.g., for a broad-band single color detector leveraging multiple color absorbing regions) or dual-color applications.

Furthermore, according to one embodiment, the plasmonic resonator 230 may be designed to allow for selectivity in one or multiple optical regimes. For example a single narrow-band resonance can be designed, and varied across the focal plane array 100 for multi- or hyper-spectral imaging. Thus, referring again to FIG. 1, different detectors 110 in the focal plane array 100 may be configured with different plasmonic resonators to achieve sensitivity in different spectral regions. For example, the period and/or dimensions of the ridges 235 may be varied from detector to detector to tailor each detector 110 to a specific waveband. In another example, various polarization sensitivities may be designed into the plasmonic resonators 230, again by varying the dimensions and/or grating period of the ridges 235.

As discussed above, in some embodiments, the detectors 200, 400, 600, 800, 1000 and/or 1200 are infrared detectors, and accordingly the semiconductor layers may include materials that are capable of detecting infrared radiation in any one or more of the NIR, SWIR, MWIR, LWIR and/or VLWIR spectral bands. One example material capable of detecting radiation is mercury cadmium telluride (HgCdTe). In one embodiment, the semiconductor layers 120, 130, 140, 210, 410, 1010 and/or 1030 at least partially comprise HgCdTe in the form of $Hg_{(1-x)}Cd_xTe$. The x value of the HgCdTe alloy composition may be chosen, for example, so as to tune the optical absorption of the corresponding semiconductor layer to the desired infrared wavelength. In other examples, the semiconductor layers 120, 130, 140, 210, 410, 1010 and/or 1030 may comprise additional and/or alternative materials responsive to radiation. For example, the semiconductor layers 120, 130, 140, 210, 410, 1010 and/or 1030 may comprise mercury cadmium zinc telluride (HgCdZnTe) and/or group III-V semiconductor materials, such as, for example, GaAs, AlGaAs, InAs, InSb, GaSb, and their alloys. As another example layers 120, 130, 140, 210, 410, 1010 and/or 1030 may be based on a type-II strained-layer superlattice structure.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A radiation detector comprising:
   a semiconductor absorber layer having a first electrical conductivity type and an energy bandgap responsive to radiation in a first spectral region, the first electrical conductivity type being one of n-type and p-type, the semiconductor absorber layer having a thickness approximately equal to a depletion width of the radiation detector;
   a semiconductor collector layer having the first electrical conductivity type;
   a plasmonic resonator abutting a top surface of the semiconductor collector layer and having a grating structure including a plurality of ridges arranged in a regularly repeating pattern, the plasmonic resonator being configured to focus the radiation in the first spectral region into the semiconductor absorber layer; and
   a barrier positioned between the semiconductor absorber layer and the semiconductor collector layer and physically separating the semiconductor absorber layer from the semiconductor collector layer.

2. The radiation detector of claim 1, wherein the plurality of ridges are interconnected to each other.

3. The radiation detector of claim 1, wherein at least one of a dimension of the plurality of ridges and a period of the grating is selected to impart a predetermined wavelength selectivity or polarization selectivity to the plasmonic resonator.

4. The radiation detector of claim 1, wherein the plasmonic resonator is connected to provide an electrical contact for the radiation detector.

5. The radiation detector of claim 4, wherein the plasmonic resonator is a metal layer.

6. The radiation detector of claim 1, further comprising a substrate, the semiconductor absorber layer being formed on the substrate and positioned between the substrate and the barrier.

7. The radiation detector of claim 1, wherein the first electrical conductivity type is n-type.

8. The radiation detector of claim 1, wherein the first electrical conductivity type is p-type.

9. The radiation detector of claim 1, wherein the first spectral region includes a plurality of wavelengths including at least one first wavelength and at least one second wavelength that is longer than the first wavelength;
   wherein the semiconductor absorber layer includes a first region responsive to radiation having the at least one first wavelength and a second region responsive to radiation having the at least one second wavelength; and
   wherein the plasmonic resonator is configured to focus the radiation having the at least one first wavelength into the first region of the semiconductor absorber layer.

10. The radiation detector of claim 9, wherein the first region of the semiconductor absorber layer has a thickness approximately equal to the depletion width of the radiation detector.

11. The radiation detector of claim 9, wherein the first region of the semiconductor absorber layer is closer to the barrier than is the second region of the semiconductor absorber layer.

12. The radiation detector of claim 1, wherein the first spectral region includes at least a portion of one of the near infrared (NIR), short-wavelength infrared (SWIR), and mid-wavelength infrared (MWIR) spectral regions.

13. A dual-band radiation detector comprising:
a substrate;
a first semiconductor absorber layer having a first electrical conductivity type and a first energy bandgap responsive to radiation in a first spectral region including a first plurality of wavelengths, the first semiconductor absorber layer being formed on the substrate, and the first electrical conductivity type being one of n-type and p-type;
a second semiconductor absorber layer having the first electrical conductivity type and a second energy bandgap responsive to radiation in a second spectral region including a second plurality of wavelengths longer than the first plurality of wavelengths, the second semiconductor absorber layer having a thickness approximately equal to a depletion width of the dual-band radiation detector;
a barrier disposed between the first semiconductor absorber layer and the second semiconductor absorber layer and physically separating the first semiconductor absorber layer from the second semiconductor absorber layer; and
a plasmonic resonator abutting a top surface of the second semiconductor absorber layer and having a grating structure including a plurality of ridges arranged in a regularly repeating pattern, the plasmonic resonator being configured to focus the radiation in the second spectral region into the second semiconductor absorber layer.

14. The dual-band radiation detector of claim 13, wherein the first and second spectral regions are infrared spectral regions.

15. The dual-band radiation detector of claim 13, wherein the plurality of ridges are interconnected to each other.

16. The dual-band radiation detector of claim 13, wherein at least one of a dimension of the plurality of ridges and a period of the grating is selected to impart a predetermined wavelength selectivity or polarization selectivity to the plasmonic resonator.

17. The dual-band radiation detector of claim 13, wherein the plasmonic resonator is connected to provide an electrical contact for the radiation detector.

18. The dual-band radiation detector of claim 17, wherein the plasmonic resonator is a metal layer.

* * * * *